United States Patent [19]

Garcia

[11] Patent Number: 4,717,995

[45] Date of Patent: Jan. 5, 1988

[54] PROCEDURE FOR CONVERTING DIRECT ELECTRICAL ENERGY INTO ALTERNATING ELECTRICAL ENERGY

[76] Inventor: Juan O. Garcia, 39, Castello Street, 28001, Madrid, Spain

[21] Appl. No.: 874,677

[22] Filed: Jun. 16, 1986

[30] Foreign Application Priority Data

May 17, 1986 [ES] Spain .................................. 555.077

[51] Int. Cl.$^4$ ............................................. H02M 7/48
[52] U.S. Cl. ...................................... 363/43; 363/131; 363/109
[58] Field of Search .................... 363/43, 71, 106, 107, 363/109, 123, 131, 135; 307/106, 151

[56] References Cited

U.S. PATENT DOCUMENTS

| | | | |
|---|---|---|---|
| 1,703,242 | 2/1929 | Kukel | 363/109 |
| 1,859,940 | 5/1932 | Spaeth | 363/109 |
| 2,192,553 | 3/1940 | Lindblom | 363/109 |
| 3,205,427 | 9/1965 | Maier | 363/109 |
| 3,697,852 | 10/1972 | Gerbitz | 363/21 |

Primary Examiner—Peter S. Wong
Attorney, Agent, or Firm—Marks Murase & White

[57] ABSTRACT

A procedure for converting direct electrical energy into alternating electrical energy is disclosed. An apparatus sequentially sweeps the connecting points of a number of DC power supplies in order to provide an alternating current wave form. The sequential sweep of each consecutive connection point is carried out such that the second connection is initiated prior to disconnecting the first connection. Overlapping connections are not, however, used where there is a reversal of the direction of the current at the output terminals. The speed of the sweep may be varied in accordance with the specific frequency required for the alternating current wave form.

19 Claims, 3 Drawing Figures

PROCEDURE FOR CONVERTING DIRECT ELECTRICAL ENERGY INTO ALTERNATING ELECTRICAL ENERGY

BACKGROUND OF THE INVENTION

1. Field of the Invention

As set out in the specification, this invention relates to a procedure for the conversion of direct electric current into alternating current by means of sequential switching, by which it is possible to obtain alternating currents of any desired voltage and frequency, using direct current sources of suitable characteristics.

2. Related Art

As is known, the present means of production and distribution of electrical energy, used at the international level, is oriented towards the use of alternating current, which implies basically that the vast majority of electrically driven apparatus available on the market is designed to use alternating current as supply power.

However, in practice, it is relatively common that, for other geographical reasons, electrical power is not available in AC form, yet it is necessary to operate equipment which is designed for use with other than direct current. In such cases, where there is normally a storage battery or some similar unit, it is essential to make use of a convertor, which transforms the direct current into alternating current so as to permit the operation of the apparatus concerned from the previously mentioned direct current power supply.

There are currently a large variety of convertors on the market, using many different schemes for obtaining improved performance according to the specific application or use, specifically as a function of the nature of the power supply, the power to be transformed, the frequency required, etc.

The basic problem with such converters are that they consume an excessive amount of internal energy, which makes their use difficult, especially when the power supplies are low power, as frequently occurs where the classical battery is used and, as well, when photovoltaic energy is used.

SUMMARY OF THE INVENTION

The conversion procedure prepared in this invention resolves this problem by minimizing internal energy consumption, and is based on sequentially switching, by means of successive sweeps of link points, between different DC supply sources. This system can be designed, as will be shown subsequently, in a large variety of ways.

In more specific terms, the present invention generates an alternating current wave form having clear, corresponding positive and negative half-cycles (which give it its "alternating" character) by taking the instantaneous values of the amplitude of a tension wave arrived at by means of sequential sweeps of connecting points of a number of DC power supplies.

According to another aspect of the invention, the sequential sweep of each two consecutive link or connection points is carried out so that the connection at the second point is initiated prior to disconnection from the first. This is a feature of each complete cycle of the wave, except for polarity changes or points of reversal of the direction of the current, where a "0" energy situation is created before the reversal is carried out.

In order to prevent short-circuiting between the DC supply sources, each link point of the sources is connected with the AC charge or outlet by means of uni-directional barriers.

Preferably, within the positive half-cycle of the wave corresponding to the alternating current to be obtained, a permanent connection is established between the negative terminal of the overall DC feed supply group and one of the AC output terminals. In parallel, during the same positive half-cycle, the other output terminal is successively and sequentially connected to the positive terminals or connection points of the different supply sources so that, during the first quarter of the period, in which the output alternating current value is positive and rising, the supplies are successively added at this terminal; then, in the second quarter period, which completes this positive half period, a sweep is made in the opposite direction, in other words, progressively eliminating the sources which had been added sequentially in the first quarter period, until reaching the initial zero voltage point.

In the second or negative half-cycle of the alternating output wave, the connections are reversed, i.e. the first terminal mentioned above remains, connected throughout the negative half to the positive output terminal of the supply source group as a whole, and the second terminal is connected to the sources, successively and sequentially with a sweep contrary to that of the previous half period, in an increasing direction during the third quarter period and a decreasing direction during the fourth quarter period which completes this second half-cycle.

Another aspect of the invention is that the speed of the sweep may be varied at will, in accordance with the specific frequency which it is wished for in the alternating current to be obtained.

As a further aspect of the invention, the DC sources are preferably connected so that the voltage at each link point, relative to the zero voltage point, is a function of the maximum amplitude of the voltage to be obtained in the alternating current, and of the angle of conduction of each link point, so as to obtain alternate sine, trapezoid, square or any other type of waves.

As yet a further aspect of the invention a single generator or energy transformer, is preferably provided with means to establish several simultaneous sweeps, duly out of phase in the angular direction, so as to create a multi-phase alternating current.

Preferably means for adjusting the link point conduction time is provided to permit adjustment in the AC output voltage.

With suitable synchronism in the sweep onsets and in the corresponding sweep speeds, several AC generators may be coupled to operate simultaneously and in parallel be compatible with commercial AC distribution networks.

Preferably, at the current direction reversal points, there are provided uni-directional barriers or static switches, for the recovery of the energy produced as a consequence of Lenz's law, with inductive means to store such charge, or else deliver the charge to a storage source.

In terms of a preferential practice design, the sweep connections are preferably made with the assistance of static switches each of which is controlled by means of an impulse generation system with floating ground or earth.

According to a preferred design, and as a further aspect of the invention, there is provided a system for the generation of impulses, the system having a floating ground, and two transistors connected so that the first conducts only when the second conducts and so that, through the base of the first, a signal is generated to a corresponding static switch according to the sequential impulses applied to the base of the second. The first transistor is connected to the static switch through the primary of a transformer having a suitable transformation ratio and core, designed in accordance with the frequency of the signal applied to it. The signal, for its part, is supplied by the transformer, duly rectified.

Following rectification of the signal, and to limit the crest of the impulse at the level required, there may be provided resistive divider with a Zener diode.

BRIEF DESCRIPTION OF THE DRAWINGS

In order to complete the description being made, and so as to assist in better understanding of the features of the invention, this specification is accompanied, as an integral part hereof, by a set of drawings in which, by way of illustration, and without limitation, the following is shown.

DETAILED DESCRIPTION OF THE PREFERRED EMBODIMENT

Figure 1:
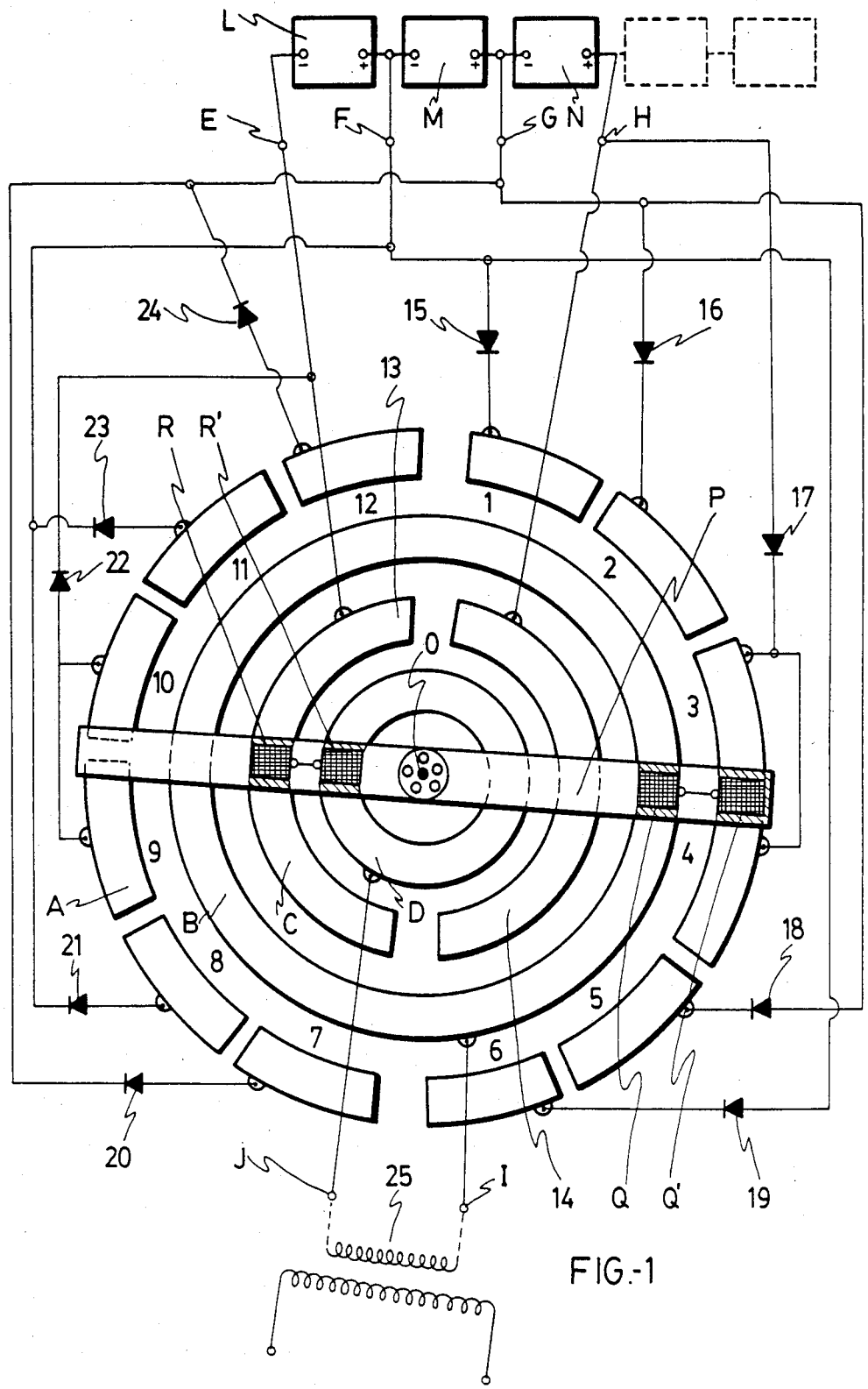
FIG. 1 shows a sample practical design of the procedure for the conversion of energy as advanced in the invention, corresponding to a theoretical and mechanical solution of extremely primitive type and which, in practise, would present all kinds of problems, in particular from the switching point of view, but which is the most suitable for understanding the philosophy behind this procedure.

In the theoretical circuit of FIG. 1, it can be seen how the procedure being advanced is given form in the arrangement on a support (not shown) of four concentric tracks of electrolytic copper or any other conducting material, electrically insulated amongst themselves and with a cross-section in accordance with the current densities it is planned to pass through them. The said tracks are marked A, B, C and D in the drawing.

Track A is divided into segments or sectors 1, 2, 3, 4, 5, 6, 7, 8, 9, 10, 11 and 12 which are all of identical dimensions. While the number of segments may vary, there must always be a number of segments which is a multiple of the number of DC supplies used. In this case, provision has been made for the use of three sources of direct current, referenced L, M, and N, and twelve segments or sectors are used.

Track B is continuous, in other words, it is made up of a single piece, without divisions.

Track D, like B, is also of a single piece, undivided.

The said tracks A, B and D are concentric; a cursor, P, collaborates with them, with its center of rotation coinciding with the point fixed by the concentricity of the tracks; the cursor, P, is rotary, being driven by a motor or the like not shown in the figure.

Cursor P is designed to constitute the drive support element for four brushes Q-Q' connected together and intended to establish the point of electrical connection between tracks A and B, while brushes R-R' are also interconnected and in turn establish the connection bridge between tracks C and D.

To return to the compartmentalization of tracks A and C, it should be emphasized that the size, and specifically the width of the brushes Q' must be more than the separation or distance between the different segments of track A, with the exception of the separation spaces between segments 1 and 12, between segments 6 and 7, which spaces define the two halves on this segmented track A, one half comprising segments 1–6 and theother segments 7–12. In this way, brush Q', on passing from one segment to another, makes contact with the second before losing contact with the first, except in the case where it passes from segments 6 to 7 and from 12 to 1, where contact with the first segment is lost before contact is made with the second.

The brush R, which travels on track C, is not as wide as the space between the two sectors, 13 and 14, of track C.

According to the structure described, the different segments of the track A are sequentially connected with track B through brushes Q-Q' by means of the rotation of the cursor and, in the same way the two segments 13 and 14 of track C are connected with track D, sequentially, through brushes R and R'.

The multiple DC sources, three in the embodiment of FIG. 1, and marked L, M and N, respectively are interconnected in series and connected to the tracks as shown in FIG. 1 and as described below.

As alluded to above P is drive, e.g., by a DC motor or the like which causes it to rotate at a speed corresponding to the frequency of the alternating current to be obtained.

During each complete turn of the cursor, in other words, every 360°, an alternating current appears at the output terminals I-J at an amplitude which is in accordance with the number of DC current sources and their voltages, and at a frequency which is a function of the speed of the motor. In the embodiment of FIG. 1, at 3000 r/min, the frequency will be 50 cps.

The voltage of this alternative suitable current may be raised if desired, by fitting a transformer, 25, in series with the AC output, I-J.

Specifically, the transformation process of the direct current into alternating current is produced as follows:
When cursor P is between segments 1 and 12 of track A, brush Q' is isolated from that track so that track A, is cut off from track B, at the same time as brush R is located between segments 13 and 14 of track C so that track C is cut off from track D. With tracks B and D isolated, there will be no voltage at the I-J output terminals.

From this point, during the rotation of the cursor, 23, brush Q' comes into contact with segment 1 of track A, which is at the positive potential of the battery L, i.e. at point F potential, in relation with point E, which in turn corresponds to the battery's negative potential, so that the positive potential F is supplied to the output terminal I through brush Q-Q', and negative potential E is transmitted to the output terminal J through brushes R-R' as these are opposed to the Q-Q' brushes within the cursor P.

As cursor P continues in its advance, brush Q' will come into contact with segment 2 of track A before losing contact with segment 1, so that output I is connected to an increase of positive potential with respect to J, corresponding to the sum of the output voltages of battery L and battery M at point G.

During the instant at which brush Q' is in simultaneous contact with segments 1-2 of track A, except for the diodes 15 and 16, the battery M is short circuited. In order to prevent problems from discharge current from this condition, an arrangement of blocking diodes 15, 16, 17, 18, 19, 20, 21, 22, 23, and 24, are provided as shown in the diagram.

Still following the movement of the cursor, brush Q' next contacts segments 3 and 4 of track A and terminal I will receive maximum voltage as against terminal J, i.e., the voltage corresponding to connection H which voltage is a function of the number of batteries used.

From segment 4 onwards, and during the cursor's clockwise movement towards segment 6 of track A, the respective connections with the supply sources F-G-H which previously resulted in an incrementally rising potential now result in an incrementally descending potential in other words, the real potential at point I will incrementally drop in the same manner as it rose during the movement along sectors 1, 2 and 3, until reaching zero, specifically at the point where brush Q' is located between segments 6 and 7 of track A.

During the 180° rotation described, a positive hemicycle or half wave has been produced in terminal I-J.

At the moment in which brush Q comes into contact with segment 7 of track A, brush R also comes into contact with segment 14 of track C, so that a change of polarity is given and, with it, a change in the direction of the current at terminals I-J.

During the continued clockwise movement of the cursor from the beginning of segment 7 to the end of segment 12, in other words, during the remaining 180° of the complete cycle, the same phenomenon is created as in the first hemicycle, but now with the current in the opposite direction, i.e. so as to obtain the relative wave hemicycle.

When the cursor once more moves to segment 1 of part A, brush R once more passes to segment 14 of track C and a new operative cycle of the system is initiated.

In accordance with the following, at the output terminals I-J and in the secondary of the transformer 25, an alternating current is obtained having a voltage which is a function of the characteristics of the DC supplies L, M and N, and with a frequency which, is a function of the speed with which cursor P is rotates.

As has also been pointed out above, by connecting the DC sources L, M and N so that the voltage at each link point F,G, H is a function of the maximum amplitude of the AC voltage to be obtained, and varying the angle or conduction time of each link point, it is possible to secure any type of wave within the general scope of alternating current, i.e., sinusoidal, trapezoid, square, etc.

By synchronizing the sweep of cursor P with that of another similar generator, it is possible to couple the two generators in parallel.

Further, by making simultaneous sweeps, in other words, by making use of several cursors which are out of phase by a pre-determined angle, it is possible to obtain poly-phased alternating current.

It should be highlighted, as has also been pointed out above, that with the establishment at the points of reversal of the current of uni-directional barriers or static switches, it is possible to recover the energy which is generaed as a result of Lenz's law, with inductive charges, so as to secure energy utilization; this energy may be applied to the charge itself, or else fed to storage sources.

Figure 2:
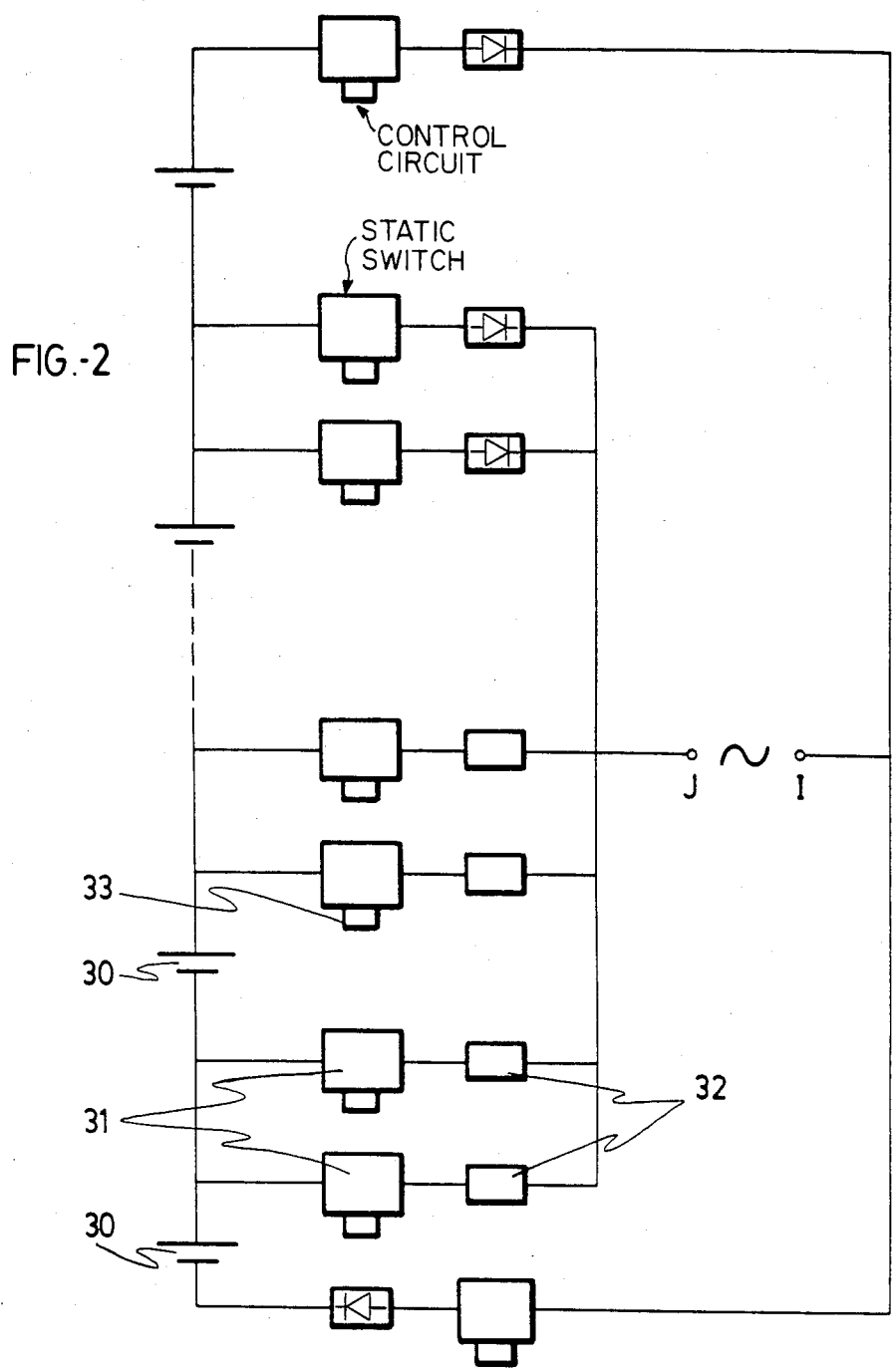
FIG. 2 is a representation in schematic form of an electronic circuit for the practical design of the procedure which, totally remote from the theoretical representation of the previous figure, is adjusted to practical reality.

As has been mentioned, the representation of FIG. 1, described exhaustively, has no further aim than to give a clear understanding of the procedure for the conversion of electrical energy as advanced here. For the practical design of this procedure, a circuit is used as shown in FIG. 2, in which there are no moving parts, and in which the supply sources are marked number 30, and where the tracks and brushes have been replaced by static switches, 31, with their corresponding uni-directional barriers, 32, and in which the same references, I-J, are used for the corresponding charge terminals or AC output terminals. Control circuits, 33, for the regulation of the static switches, 31, are shown in detail in FIG. 3.

Figure 3:
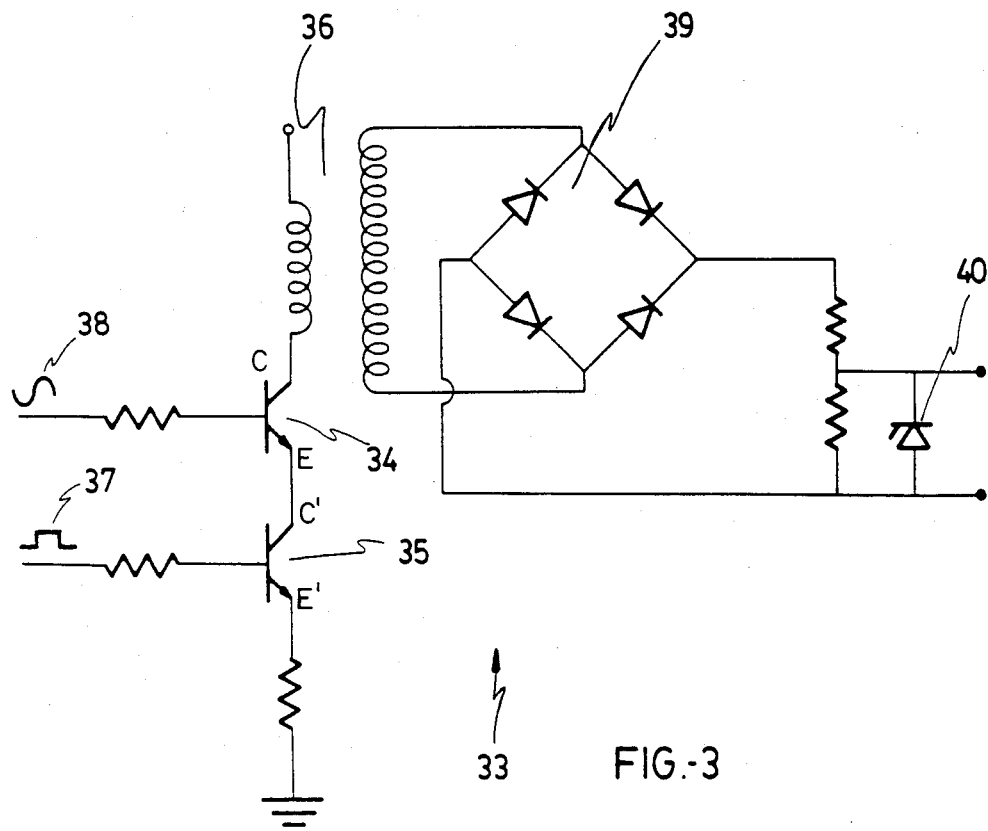
FIG. 3 shows details of the circuit for the control of each of the static switches involved in the general circuit of FIG. 2.

With this circuit, in FIG. 3, and, as has already been pointed out, it is possible to create control impulses for the static switches, 31, with floating earth or ground, in other words so that the said control impulses are insulated from any other circuit, in the general context of the convertor.

Two transistors, 34 and 35, are used to do this; they are connected so that the emitter of transistor 34 is connected to the collector of transistor 35 so that the former is able to conduct only as long as the latter does so.

The collector of transistor 34 is connected to the supply, i.e. to the corresponding static switch, through the primary of a transformer 36, with a suitable transformation ratio, and with a core in accordance with the frequency of the signal applied to it.

At the base of transistor 35, a series of impulses, 37, are applied, in sequential form, so as to define the conduction of the linking points, the oft-cited "sequential sweep".

Both transistors will conduct during the period of the sequential impulse, 37, applied to the base of transistor 35 and, as a consequence, in the secondary of transformer 36 a voltage, corresponding to the signal 38 applied to the base of transistor 34, will appear having a voltage amplified as a function of the transformation ratio of the transformer 36.

This signal is rectified with a full-wave rectifier, 39, on the diode bridge which is shown in FIG. 3, so as to obtain an impulse of duration equal to the duration of the pulse applied to the base of transistor 35, with an amplified voltage, and insulated from earth or ground, in other words, with a floating earth or ground, which will serve to control the conduction of the static switches at the linking points.

As has also been pointed out aove, in order to perfect the impulse and cut the peak ripple, a resistive divider is used with a Zener diode, 40, which makes it possible to cut the impulse at the desired level so as to establish the up and down times likewise as required.

It is not thought necessary to amplify this description for any expert in the field to understand the scope of the invention and the advantages derived from it.

The materials, form, size and layout of the elements will be susceptible to variation, always provided that this does not involve an alteration to the essence of the invention.

The terms in which these specifications have been set out must at all times be taken in their broad and nonlimitative sense.

What is claimed is:

1. A method of converting direct current into alternating current comprising the steps of:
   (a) connecting a first voltage through a uni-directional barrier to a first output terminal;
   (b) connecting a second variable voltage, having an initial value greater than said first voltage, through a uni-directional barrier to a second output terminal;
   (c) incrementally increasing said second voltage towards a predeteermined maximum voltage;
   (d) incrementally decreasing said second voltage towards said initial value of said second voltage;
   (e) connecting a third voltage through a uni-directional barrier to said first output terminal;
   (f) connecting a fourth variable voltage, having an initial value less than said third voltage, through a uni-directional barrier to said second output terminal;
   (g) incrementally decreasing said fourth voltage towards a predetermined minimum voltage;
   (h) incrementally increasing said fourth voltage towards said initial value of said fourth voltage;
   (i) repeating steps (a) through (h).

2. The method of claim 1, wherein the voltage at the second terminal is V and each step of incrementally increasing comprises:
   (a) maintaining V at said second output terminal at a voltage $V_1$;
   (b) connecting a voltage $V_2$ greater than $V_1$ through a uni-directional barrier to said second output terminal;
   (c) disconnecting $V_1$ from said second output terminal;
   (d) repeating steps (a) through (c) until said second output terminal reaches the predetermined minimum or maximum voltage, respectively.

3. The method according to claim 2, wherein a plurality of first, second, third and fourth DC voltages are applied to a plurality of first and second output terminals and further comprising the step of:
   synchronizing conduction periods of said first, second, third and fourth voltages.

4. The method of claim 1, wherein the voltage at the second terminal is V and the step of incrementally decreasing comprises:
   (a) maintaining V at said second output terminal at a voltage $V_1$;
   (b) connecting a voltage $V_2$ of less than $V_1$ through a uni-directional barrier to said second output terminal;
   (c) disconnecting $V_1$ from said second output terminal;
   (d) connecting a voltage of less than $V_2$ through a uni-directional barrier to said second output terminal;
   (e) disconnecting voltage $V_2$ from said second output terminal;
   (f) repeating steps (d) through (e) until said second output terminal reaches the predetermined minimum voltage.

5. The method according to claim 4, wherein a plurality of first, second, third and fourth DC voltages are applied to plurality of first and second output terminals and further comprising the steps of:
   (a) synchronizing conduction periods of said first, second, third and fourth voltages.

6. The method according to claim 1, wherein said first and third voltages are constant; and wherein said predetermined maximum and minimum values of said second and fourth voltages, respectively, equal said third and first voltages, respectively.

7. The method according to claim 1, further comprising the step of:
   disconnecting said first and second voltages from said first output terminal and said second and fourth voltages from said second output terminal prior to any reversal in direction of a current running from said first output terminal to said second output terminal.

8. The method according to claim 1, wherein said first, second, third, and fourth voltages are delivered from voltage supplies and, wherein an inductive load is connected across said first and second output terminals through which an output current flows, further comprising the step of:
   recovering any energy, produced during reversals in polarity of the output current, from an induced current of the inductive load.

9. The method of claim 1, wherein the respective time periods during which each value of said first, second, third and fourth voltages are connected are variable.

10. The method of claim 9, wherein each of said variable time periods are equal.

11. The method of claim 10, wherein ones of said time periods are unequal to others of said variable time periods.

12. The method according to claim 1, wherein the steps of connecting a voltage each comprise:
   (a) generating an impulse from a control circuit having a floating ground;
   (b) closing a static switch disposed between the respective voltage and output terminal in response to said impulse.

13. An apparatus for converting direct current to alternating current comprising:
   a plurality of direct current voltage supplies;
   a first plurality of switch means connected between each respective voltage supply and a first pair of output terminals;
   a plurality of control means connected to each respective switch means for selectively connecting each voltage supply to said pair of output terminals; and
   a plurality of uni-directional barriers connected between said switch means and said pair of output terminals.

14. The apparatus according to claim 13, wherein said control means comprise:
   means for receiving a series of timing pulses and for processing an input signal; and
   means for applying a timed series of processed signals to one of said respective switch means.

15. The apparatus according to claim 13, wherein said control means comprise:
   a pair of series connected transistor means for processing an input signal in accordance with a series of timing impulses;
   a transformer means connected to said pair of transistors for transforming said input signal; and
   a rectifying means for rectifying said transformed signal and providing said transformed signal to one of said respective output switch means.

16. The apparatus of claim 15, further comprising a clipping means for clipping said transformed signal.

17. The apparatus of claim 16, wherein said clipping means comprises a resistive divider network and a Zener diode across an output resistor of said network.

18. The apparatus according to claim 13, wherein said control means comprise a means for selectively maintaining a connection between each respective voltage supply and said pair of output terminals; and
means for disconnecting each respective voltage supply from said pair of output terminals after connection of a successive voltage supply thereto.

19. An apparatus according to claim 13, wherein said control means further comprises:
means responsive to a series of impulses for defining a time period during which a respective switch means is enabled.

* * * * *